(12) United States Patent
Hsieh et al.

(10) Patent No.: US 12,174,405 B2
(45) Date of Patent: Dec. 24, 2024

(54) OPTICAL STRUCTURE HAVING POLYMER-COVERED PROTRUSIONS CONTACTING BANDPASS FILTER

(71) Applicant: VisEra Technologies Company Limited, Hsin-Chu (TW)

(72) Inventors: Chin-Chuan Hsieh, Hsin-Chu (TW); Kuo-Feng Lin, Kaohsiung (TW); Shih-Yu Ho, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 513 days.

(21) Appl. No.: 16/952,498

(22) Filed: Nov. 19, 2020

(65) Prior Publication Data

US 2022/0155504 A1    May 19, 2022

(51) Int. Cl.
*G02B 5/20* (2006.01)
*G06V 10/147* (2022.01)
*G06V 40/13* (2022.01)
*H04N 23/54* (2023.01)

(52) U.S. Cl.
CPC .......... *G02B 5/208* (2013.01); *G06V 10/147* (2022.01); *G06V 40/1318* (2022.01); *H04N 23/54* (2023.01)

(58) Field of Classification Search
CPC ....... B82Y 20/00; G01J 1/0204; G01J 1/0411; G01J 1/0488; G01J 3/0208; G01J 3/0256; G01J 3/513; G02B 1/002; G02B 1/02; G02B 1/04; G02B 1/14; G02B 3/0043; G02B 3/08; G02B 5/20; G02B 5/208; G02B 5/281; G06V 10/147; G06V 40/1318; H01L 27/146; H01L 27/14618; H01L 27/14625;
(Continued)

(56) References Cited

U.S. PATENT DOCUMENTS

| | | | | |
|---|---|---|---|---|
| 3,942,899 A | * | 3/1976 | Longhenry | G01N 21/4785 356/243.8 |
| 4,135,489 A | * | 1/1979 | Jarvinen | F24S 10/80 126/648 |
| 9,293,653 B2 | * | 3/2016 | Veerasamy | H01L 33/22 |

(Continued)

FOREIGN PATENT DOCUMENTS

| CN | 110873914 A | 3/2020 |
|---|---|---|
| CN | 111866387 A | 10/2020 |

(Continued)

OTHER PUBLICATIONS

Office Action mailed Apr. 26, 2022 in TW Application No. 110120862, 6 pages.

(Continued)

*Primary Examiner* — Ryan S Dunning
(74) *Attorney, Agent, or Firm* — Muncy, Geissler, Olds & Lowe, P.C.

(57) ABSTRACT

An optical structure is provided. The optical structure includes a sensor, a bandpass filter and a plurality of protrusions. The bandpass filter is disposed above the sensor. The protrusions are disposed on the bandpass filter. The bandpass filter allows light with a wavelength of 700 nm to 3,000 nm to pass through. The protrusions have a size distribution that controls the phase of the incident light to be between 0 and 2π.

19 Claims, 17 Drawing Sheets

(58) Field of Classification Search
CPC ......... H01L 27/14627; H01L 27/14634; H01L 23/54; H01L 23/55
See application file for complete search history.

(56) References Cited

U.S. PATENT DOCUMENTS

| | | | |
|---|---|---|---|
| 10,502,971 B1* | 12/2019 | Chung | G02B 27/30 |
| 11,471,078 B1* | 10/2022 | Davis | A61B 5/0075 |
| 2012/0001286 A1 | 1/2012 | Yoon | |
| 2012/0097415 A1* | 4/2012 | Reinert | H01L 27/14683 |
| | | | 174/50 |
| 2013/0003180 A1 | 1/2013 | Choi et al. | |
| 2014/0263956 A1 | 9/2014 | Jian et al. | |
| 2015/0117811 A1 | 4/2015 | Heroux | |
| 2016/0218129 A1 | 7/2016 | Liu et al. | |
| 2017/0082263 A1 | 3/2017 | Byrnes et al. | |
| 2017/0200760 A1* | 7/2017 | Zhang | H01L 27/1462 |
| 2019/0033683 A1 | 1/2019 | Ahmed et al. | |
| 2019/0064532 A1 | 2/2019 | Riley, Jr. et al. | |
| 2019/0187347 A1* | 6/2019 | Bilger | G02B 5/281 |
| 2019/0339418 A1* | 11/2019 | Sirbuly | C23C 16/45525 |
| 2020/0098814 A1 | 3/2020 | Yang | |
| 2020/0225386 A1 | 7/2020 | Tsai et al. | |
| 2020/0264343 A1 | 8/2020 | Han et al. | |
| 2020/0348500 A1* | 11/2020 | Kwon | G01J 9/02 |

FOREIGN PATENT DOCUMENTS

| | | |
|---|---|---|
| JP | 2015092234 A | 5/2015 |
| JP | 2018156999 A | 10/2018 |
| KR | 10-2009-0040637 | 4/2009 |
| KR | 10-2019-0015378 A | 2/2019 |
| KR | 10-2055579 B1 | 12/2019 |
| KR | 20200071586 A | 6/2020 |
| TW | 201929248 A | 7/2019 |
| WO | WO-2020/201111 A1 | 10/2020 |

OTHER PUBLICATIONS

Extended European Search Report mailed Sep. 24, 2021 in EP Application No. 21166917.1, 7 pages.
Office Action of corresponding KR Application No. 10-2021-0049117 dated Aug. 16, 2023.
Office Action of corresponding KR Application No. 10-2021-0049117 dated Feb. 15, 2024.

* cited by examiner

OPTICAL STRUCTURE HAVING POLYMER-COVERED PROTRUSIONS CONTACTING BANDPASS FILTER

BACKGROUND OF THE INVENTION

Field of the Invention

The present invention relates to an optical structure, and more particularly to an optical structure having a planar lens.

Description of the Related Art

An IR camera device currently includes a near infrared (NIR) Complementary Metal-Oxide-Semiconductor (CMOS) image sensor, a bandpass filter, and a plastic lens set. The bandpass filter is disposed above the NIR CMOS image sensor. The plastic lens set includes a plurality of lenses which are vertically stacked on the bandpass filter. The vertical height of the IR camera device is greater than 3.5 mm due to the vertically-stacked plastic lens set, which is unfavorable to development of miniaturization of semiconductor components.

Therefore, development of an optical structure with low vertical height capable of maintaining proper optical effects is desirable.

BRIEF SUMMARY OF THE INVENTION

In accordance with one embodiment of the invention, an optical structure is provided. The optical structure includes a sensor, a first bandpass filter and a plurality of protrusions. The first bandpass filter is disposed above the sensor. The protrusions are disposed on the first bandpass filter.

In some embodiments, the sensor includes a CMOS image sensor or a fingerprint sensor.

In some embodiments, the first bandpass filter allows light with a wavelength of 700 nm to 3,000 nm to pass through.

In some embodiments, the protrusions include cylinders, hexagonal pillars or square pillars. In some embodiments, at least one of the protrusions includes a first portion and a space surrounded by the first portion. In some embodiments, the protrusion further includes a second portion surrounded by the space. In some embodiments, the protrusions are cylinders, and each of the protrusions has a diameter of 150 nm to 300 nm. In some embodiments, the protrusions include a high-refractive-index material with a refractive index of 3.0 to 5.0. In some embodiments, the protrusions include $TiO_2$, SiN, $SiO_2$, SiH or a combination thereof. In some embodiments, the protrusions have a pitch of 100 nm to 1,000 nm. In some embodiments, the protrusions have a size distribution that controls the phase of the incident light to be between 0 and 2 $\pi$.

In some embodiments, the optical structure further includes a glass substrate 50 μm to 500 μm thick disposed between the sensor and the first bandpass filter, and the first bandpass filter is disposed on a top side of the glass substrate. In some embodiments, the optical structure further includes a second bandpass filter disposed on a bottom side of the glass substrate.

In some embodiments, there is a space between the sensor and the glass substrate. In some embodiments, the optical structure further includes a low-refractive-index material, a normal-refractive-index material or a combination thereof filled in the space.

In some embodiments, the optical structure further includes a low-refractive-index material layer disposed between the sensor and the first bandpass filter. In some embodiments, the optical structure further includes a polymer layer disposed between the low-refractive-index material layer and the first bandpass filter. In some embodiments, the optical structure further includes a plurality of second protrusions disposed in the polymer layer.

In some embodiments, the optical structure further includes a second polymer layer which covers the first bandpass filter and the protrusions. In some embodiments, the optical structure further includes an anti-reflective layer disposed on the second polymer layer.

In some embodiments, the sensor is connected to a printed circuit board by wire bonding. In some embodiments, the sensor is connected to a printed circuit board by solder balls.

The present invention replaces conventional vertically-stacked module lens by planar lens (for instance, metalens or Fresnel lens). When the planar lens and a bandpass filter are combined on a glass substrate with an appropriate thickness and packaged in a COB (Chip On Board) manner, the height of the overall package is reduced to less than about 2 mm. When the planar lens and a bandpass filter are combined on a glass substrate with an appropriate thickness and packaged in a CSP (Chip Scale Package) manner, the height of the overall package is reduced to less than about 1.2 mm, and the package dimension in X-Y direction is also reduced. When the planar lens and a bandpass filter are stacked on a chip by a wafer process and packaged in a COB (Chip On Board) manner, the height of the overall package is reduced to less than about 1.0 mm. The optimal size distribution of the planar lens controls the phase of the incident light to be between 0 and 2 $\pi$, achieving optical maneuverability and controlling wave behavior. In addition, the transmission of the planar lens reaches more than about 80%, eliminating the influence of reflection and refraction. The planar lens has a focusing function, which is also enough to show that it can replace conventional vertically-stacked module lenses. Furthermore, the solid or hollow planar lens copes with the situation that light passing through the planar lens may include single wavelength or multiple wavelengths, effectively reducing the dispersion (aberration).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
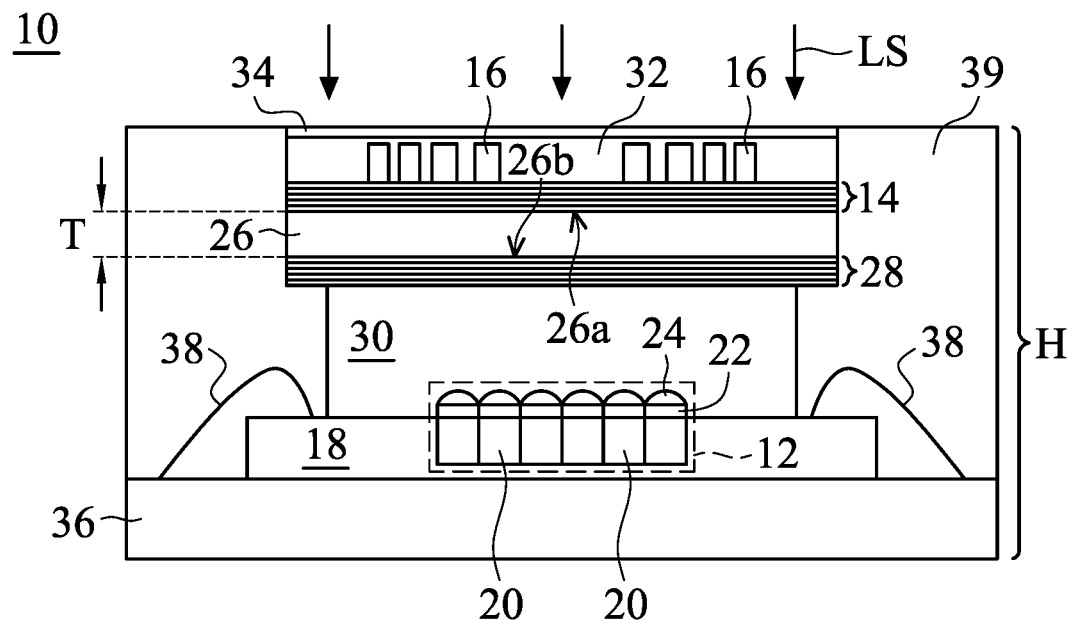
FIG. 1 is a cross-sectional view of an optical structure in accordance with one embodiment of the invention.

The optical structure of the present invention is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed as referring to the orientation as described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

Herein, the terms "about", "around" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present disclosure is an approximate value. Namely, the meaning of "about", "around" and "substantially" may be implied if there is no specific description of "about", "around" and "substantially".

The following description is of the best-contemplated mode of carrying out the invention. This description is made for the purpose of illustrating the general principles of the invention and should not be taken in a limiting sense. The scope of the invention is best determined by reference to the appended claims.

Referring to FIG. 1, in accordance with one embodiment of the invention, an optical structure 10 is provided. FIG. 1 shows a cross-sectional view of the optical structure 10.

In FIG. 1, the optical structure 10 includes a sensor 12, a first bandpass filter 14 and a plurality of protrusions 16. The first bandpass filter 14 is disposed above the sensor 12. The protrusions 16 are disposed on the first bandpass filter 14.

The sensor 12 includes a substrate 18, a plurality of photoelectric conversion units 20, a plurality of color filters 22 and a plurality of microlenses 24. The photoelectric conversion units 20 are disposed in the substrate 18. The color filters 22 are disposed on the substrate 18 and respectively correspond to the photoelectric conversion units 20. The microlenses 24 are disposed on the color filters 22 and respectively correspond to the photoelectric conversion units 20.

In some embodiments, the substrate 18 may include a bulk semiconductor substrate, such as a semiconductor wafer. For example, the substrate 18 may include a silicon wafer. The substrate 18 may include silicon or another elementary semiconductor material such as germanium. In some embodiments, the substrate 18 may include a compound semiconductor. The compound semiconductor may include gallium arsenide, silicon carbide, indium arsenide, indium phosphide, another suitable material or a combination thereof. In some embodiments, the substrate 18 may include a semiconductor-on-insulator (SOI) substrate. The semiconductor-on-insulator (SOI) substrate may be fabricated using a separation by implantation of oxygen (SIMOX) process, a wafer bonding process, another applicable method, or a combination thereof. In some embodiments, the substrate 18 may include an un-doped substrate.

In some embodiments, the photoelectric conversion units 20 may include components that convert light into electricity, for example, photodiodes (PDs). In some embodiments, the color filters 22 may include organic color filters or inorganic color filters. In some embodiments, the color filters 22 may include red (R) color filters, green (G) color filters, blue (B) color filters or a combination thereof.

In FIG. 1, the sensor 12 includes a CMOS image sensor. In some embodiments, the sensor 12 may include other suitable sensors, such as a fingerprint sensor.

In some embodiments, the first bandpass filter 14 may include a single layer or multiple layers. In some embodiments, the material of the first bandpass filter 14 may include SiH, SiGe, GeH or a combination thereof. In some embodiments, the first bandpass filter 14 (i.e. a near IR bandpass filter) may allow light with a wavelength of about 700 nm to about 3,000 nm to pass through. For example, the first bandpass filter 14 may allow light with a single wavelength of about 850 nm, about 940 nm, about 1350 nm or about 1550 nm to pass through, or may allow light with multiple wavelengths of about 850±5 nm, about 940±5 nm, about 1350±5 nm, about 1550±5 nm or a combination thereof to pass through.

In some embodiments, the protrusions 16 may include a high-refractive-index material with a refractive index of about 3.0 to about 5.0. In some embodiments, the material of the protrusions may include $TiO_2$, SiN, $SiO_2$, SiH or a combination thereof. The structures, shapes, dimensions and arrangements of the protrusions 16 are detailed later (in FIGS. 5-8).

In FIG. 1, the optical structure 10 further includes a glass substrate 26. The glass substrate 26 is disposed between the sensor 12 and the first bandpass filter 14. In some embodiments, the thickness "T" of the glass substrate 26 may range from about 50 μm to about 500 μm. The first bandpass filter 14 is disposed on the top side 26a of the glass substrate 26. The optical structure 10 further includes a second bandpass filter 28. The second bandpass filter 28 is disposed on the bottom side 26b of the glass substrate 26. In some embodiments, the second bandpass filter 28 is similar to the first bandpass filter 14. That is, the second bandpass filter 28 (i.e. a near IR bandpass filter) may allow light with a wavelength of about 700 nm to about 3,000 nm to pass through. For example, the second bandpass filter 28 may allow light with a single wavelength of about 850 nm, about 940 nm, about 1350 nm or about 1550 nm to pass through, or may allow light with multiple wavelengths of about 850±5 nm, about 940±5 nm, about 1350±5 nm, about 1550±5 nm or a combination thereof to pass through. In some embodiments, either the first bandpass filter 14 or the second bandpass filter 28 may be omitted. In some embodiments, alternatively, the protrusions 16 may be disposed on the bottom side 26b of the glass substrate 26. For example, the protrusions 16 may be disposed on the second bandpass filter 28 towards the sensor 12.

In FIG. 1, there is a space 30 between the sensor 12 and the glass substrate 26. In some embodiments, the optical structure 10 may further include a low-refractive-index material (n<1.45), a normal-refractive-index material (n>1.5) or a combination thereof filled in the space 30.

In FIG. 1, the optical structure 10 further includes a polymer layer 32 which covers and protects the underneath first bandpass filter 14 and the protrusions 16. In some embodiments, the polymer layer 32 may include high-transmittance polymer material with a refractive index of about 1.2 to about 2.0. The optical structure 10 further includes an anti-reflective layer 34. The anti-reflective layer 34 is disposed on the polymer layer 32.

In FIG. 1, the sensor 12 is connected to a printed circuit board (PCB) 36 by wire bonding 38. That is, the optical structure 10 is packaged in a COB (Chip On Board) manner. An encapsulation material 39 covers a part of the substrate 18 and the printed circuit board (PCB) 36, and surrounds the glass substrate 26 and the components formed thereon, leaving the space 30. In some embodiments, the height "H" of the COB package of the optical structure 10 is less than about 2 mm. In addition, a light source "LS" is disposed above the optical structure 10. In some embodiments, the light source "LS" emits light with a single wavelength of about 850 nm, about 940 nm, about 1350 nm or about 1550 nm. In some embodiments, the light source "LS" emits light with multiple wavelengths of about 850±5 nm, about 940±5 nm, about 1350±5 nm or about 1550±5 nm. In some embodiments, the light source "LS" may be a Vertical-Cavity Surface-Emitting Laser (VCSEL).

Figure 2:
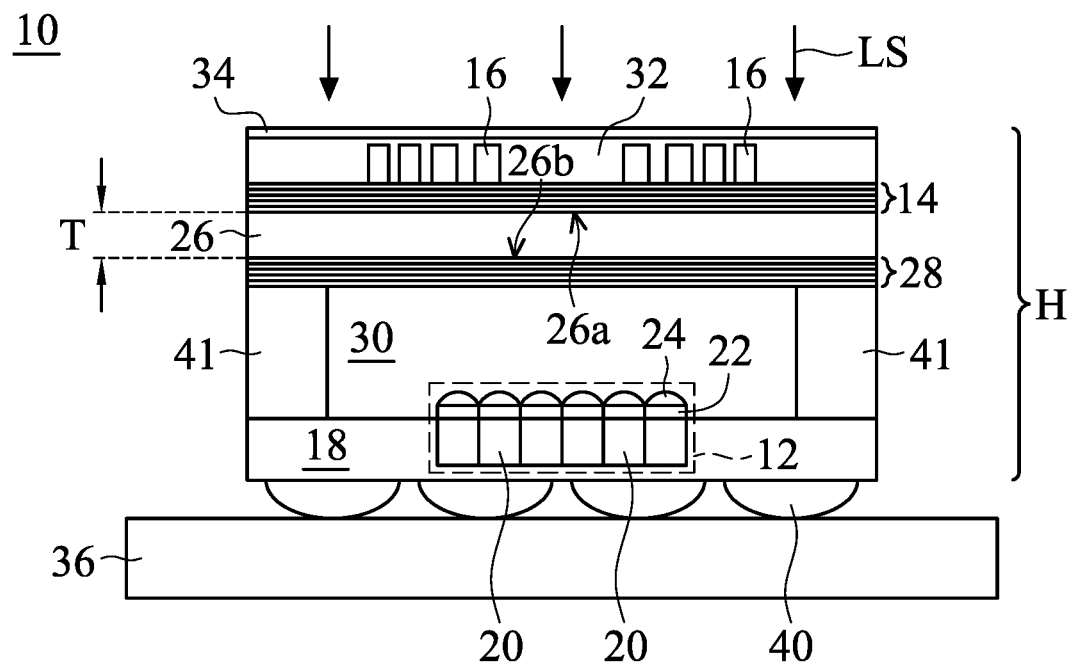
FIG. 2 is a cross-sectional view of an optical structure in accordance with one embodiment of the invention.

Referring to FIG. 2, in accordance with one embodiment of the invention, an optical structure 10 is provided. FIG. 2 shows a cross-sectional view of the optical structure 10.

A part of the optical structure 10 of FIG. 2 is similar to the optical structure 10 of FIG. 1. In FIG. 2, the sensor 12 is connected to a printed circuit board (PCB) 36 by solder balls 40. That is, the optical structure 10 is packaged in a CSP (Chip Scale Package) manner. An encapsulation material 41 is disposed between the substrate 18 and the glass substrate 26, leaving the space 30. In some embodiments, the height "H" of the CSP package of the optical structure 10 is less than about 1.2 mm. In addition, a light source "LS" is disposed above the optical structure 10. In some embodiments, the light source "LS" emits light with a single wavelength of about 850 nm, about 940 nm, about 1350 nm or about 1550 nm. In some embodiments, the light source "LS" emits light with multiple wavelengths of about 850±5 nm, about 940±5 nm, about 1350±5 nm or about 1550±5 nm. In some embodiments, the light source "LS" may be a Vertical-Cavity Surface-Emitting Laser (VCSEL).

Figure 3:
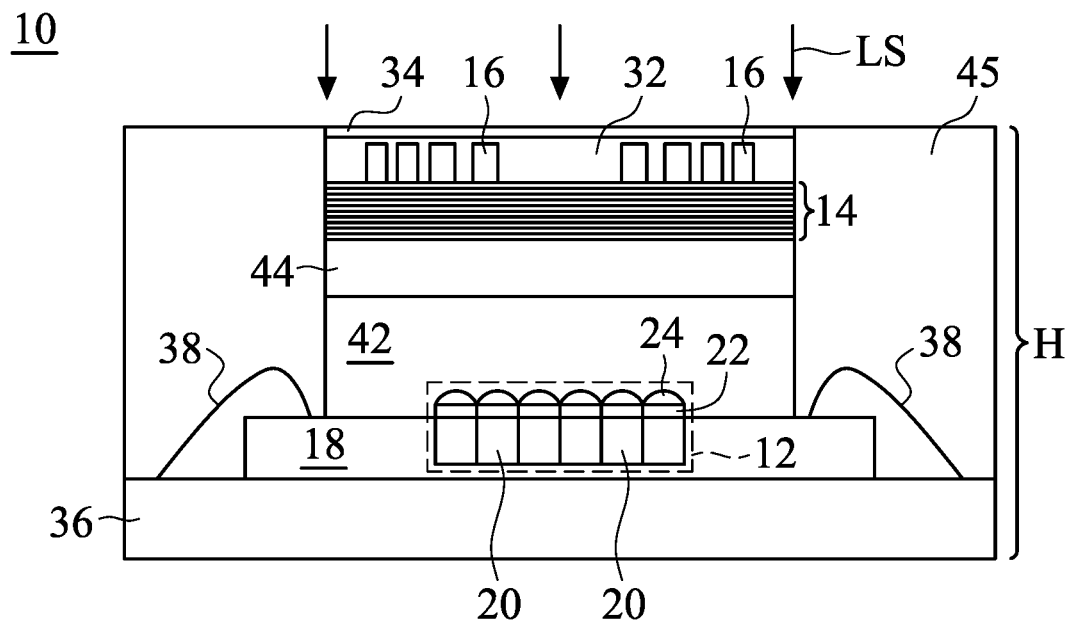
FIG. 3 is a cross-sectional view of an optical structure in accordance with one embodiment of the invention.

Referring to FIG. 3, in accordance with one embodiment of the invention, an optical structure 10 is provided. FIG. 3 shows a cross-sectional view of the optical structure 10.

In FIG. 3, the optical structure 10 includes a sensor 12, a bandpass filter 14 and a plurality of protrusions 16. The bandpass filter 14 is disposed above the sensor 12. The protrusions 16 are disposed on the bandpass filter 14.

The sensor 12 includes a substrate 18, a plurality of photoelectric conversion units 20, a plurality of color filters 22 and a plurality of microlenses 24. The photoelectric conversion units 20 are disposed in the substrate 18. The color filters 22 are disposed on the substrate 18 and respectively correspond to the photoelectric conversion units 20. The microlenses 24 are disposed on the color filters 22 and respectively correspond to the photoelectric conversion units 20.

In some embodiments, the substrate 18 may include a bulk semiconductor substrate, such as a semiconductor wafer. For example, the substrate 18 may include a silicon wafer. The substrate 18 may include silicon or another elementary semiconductor material such as germanium. In some embodiments, the substrate 18 may include a compound semiconductor. The compound semiconductor may include gallium arsenide, silicon carbide, indium arsenide, indium phosphide, another suitable material or a combination thereof. In some embodiments, the substrate 18 may include a semiconductor-on-insulator (SOI) substrate. The semiconductor-on-insulator (SOI) substrate may be fabricated using a separation by implantation of oxygen (SI-MOX) process, a wafer bonding process, another applicable method, or a combination thereof. In some embodiments, the substrate 18 may include an un-doped substrate.

In some embodiments, the photoelectric conversion units 20 may include components that convert light into electricity, for example, photodiodes (PDs). In some embodiments, the color filters 22 may include organic color filters or inorganic color filters. In some embodiments, the color filters 22 may include red (R) color filters, green (G) color filters, blue (B) color filters or a combination thereof.

In FIG. 3, the sensor 12 includes a CMOS image sensor. In some embodiments, the sensor 12 may include other suitable sensors, such as a fingerprint sensor.

In some embodiments, the bandpass filter 14 may include a single layer or multiple layers. In some embodiments, the material of the bandpass filter 14 may include SiH, SiGe, GeH or a combination thereof. In some embodiments, the bandpass filter 14 (i.e. a near IR bandpass filter) may allow light with a wavelength of about 700 nm to about 3,000 nm to pass through. For example, the bandpass filter 14 may allow light with a single wavelength of about 850 nm, about 940 nm, about 1350 nm or about 1550 nm to pass through, or may allow light with multiple wavelengths of about 850±5 nm, about 940±5 nm, about 1350±5 nm, about 1550±5 nm or a combination thereof to pass through.

In some embodiments, the protrusions 16 may include a high-refractive-index material with a refractive index of about 3.0 to about 5.0. In some embodiments, the material of the protrusions may include $TiO_2$, SiN, $SiO_2$, SiH or a combination thereof. The structures, shapes, dimensions and arrangements of the protrusions 16 are detailed later (in FIGS. 5-8).

In FIG. 3, the optical structure 10 further includes a low-refractive-index material layer 42. The low-refractive-index material layer 42 is disposed between the sensor 12 and the bandpass filter 14. In some embodiments, considering the path and distance of the incident light, the low-refractive-index material layer 42 with an appropriate thickness is utilized. In addition, the low-refractive-index material layer 42 can reduce the refractive index of the underneath microlenses 24.

In FIG. 3, the optical structure 10 further includes a polymer layer 44. The polymer layer 44 is disposed between the low-refractive-index material layer 42 and the bandpass filter 14. In some embodiments, considering the path and distance of the incident light, the polymer layer 44 with an appropriate thickness is utilized.

In FIG. 3, the optical structure 10 further includes a polymer layer 32 which covers and protects the underneath bandpass filter 14 and the protrusions 16. In some embodiments, the polymer layer 32 may include high-transmittance polymer material with a refractive index of about 1.2 to about 2.0. The optical structure 10 further includes an anti-reflective layer 34. The anti-reflective layer 34 is disposed on the polymer layer 32.

In FIG. 3, the sensor 12 is connected to a printed circuit board (PCB) 36 by wire bonding 38. That is, the optical structure 10 is packaged in a COB (Chip On Board) manner. An encapsulation material 45 covers a part of the substrate 18 and the printed circuit board (PCB) 36, and surrounds the low-refractive-index material layer 42 and the components formed thereon. In some embodiments, the height "H" of the COB package of the optical structure 10 is less than about 1.0 mm. In addition, a light source "LS" is disposed above the optical structure 10. In some embodiments, the light source "LS" emits light with a single wavelength of about 850 nm, about 940 nm, about 1350 nm or about 1550 nm. In some embodiments, the light source "LS" emits light with multiple wavelengths of about 850±5 nm, about 940±5 nm, about 1350±5 nm or about 1550±5 nm. In some embodiments, the light source "LS" may be a Vertical-Cavity Surface-Emitting Laser (VCSEL).

Figure 4:
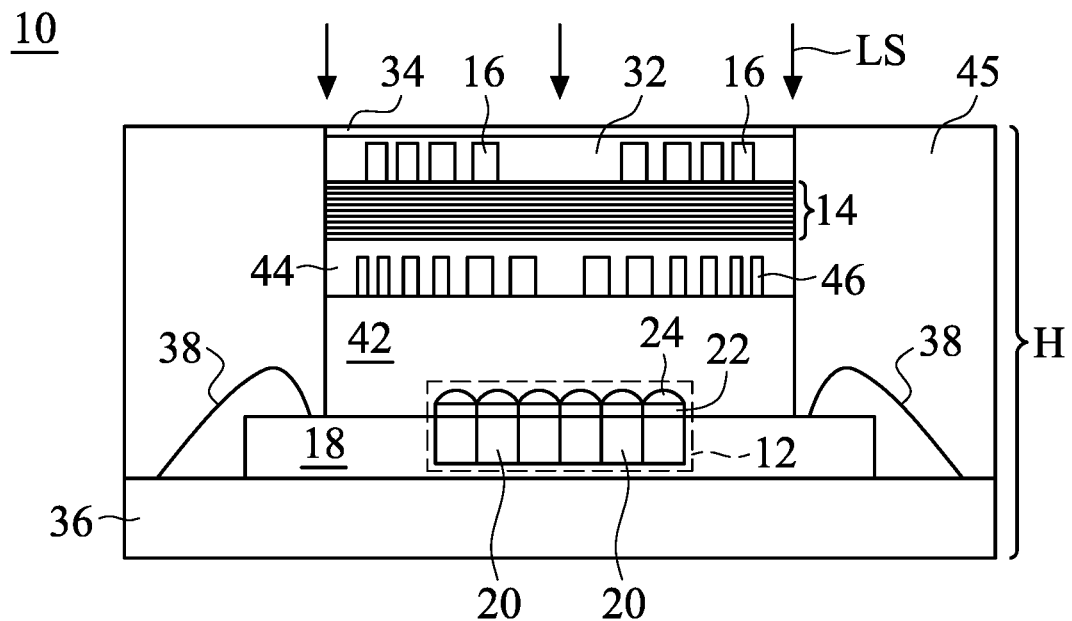
FIG. 4 is a cross-sectional view of an optical structure in accordance with one embodiment of the invention.

Referring to FIG. 4, in accordance with one embodiment of the invention, an optical structure 10 is provided. FIG. 4 shows a cross-sectional view of the optical structure 10.

A part of the optical structure 10 of FIG. 4 is similar to the optical structure 10 of FIG. 3. In FIG. 4, the optical structure 10 further includes a plurality of second protrusions 46. The second protrusions 46 is disposed in the polymer layer 44. The structures, shapes, dimensions and arrangements of the second protrusions 46 are similar to those of the protrusions 16 and detailed in FIGS. 5-8.

In FIGS. 3 and 4, the optical structure 10 is packaged in a COB (Chip On Board) manner. However, in some embodiments, the optical structure 10 may also be packaged in a CSP (Chip Scale Package) manner, as shown in FIG. 2.

Figure 5:
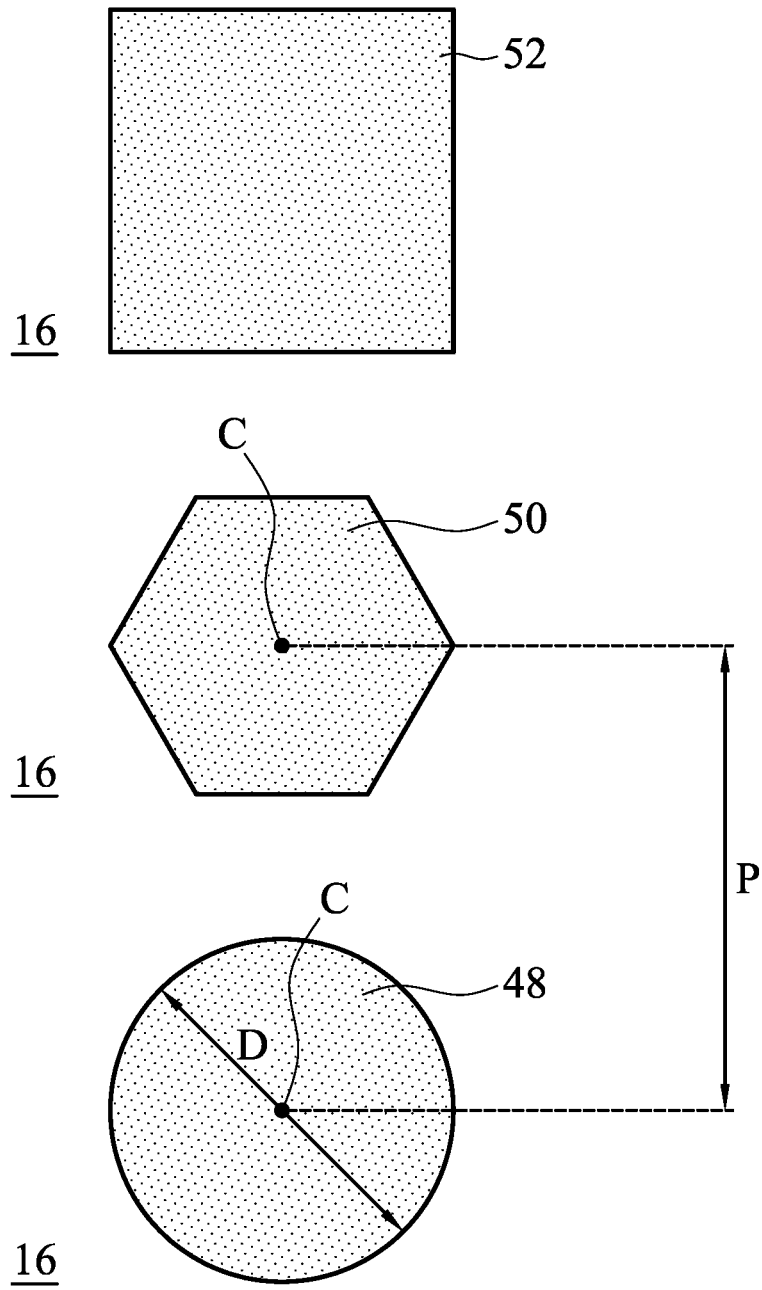
FIG. 5 is a top view of protrusions of an optical structure in accordance with one embodiment of the invention.
Figure 6:
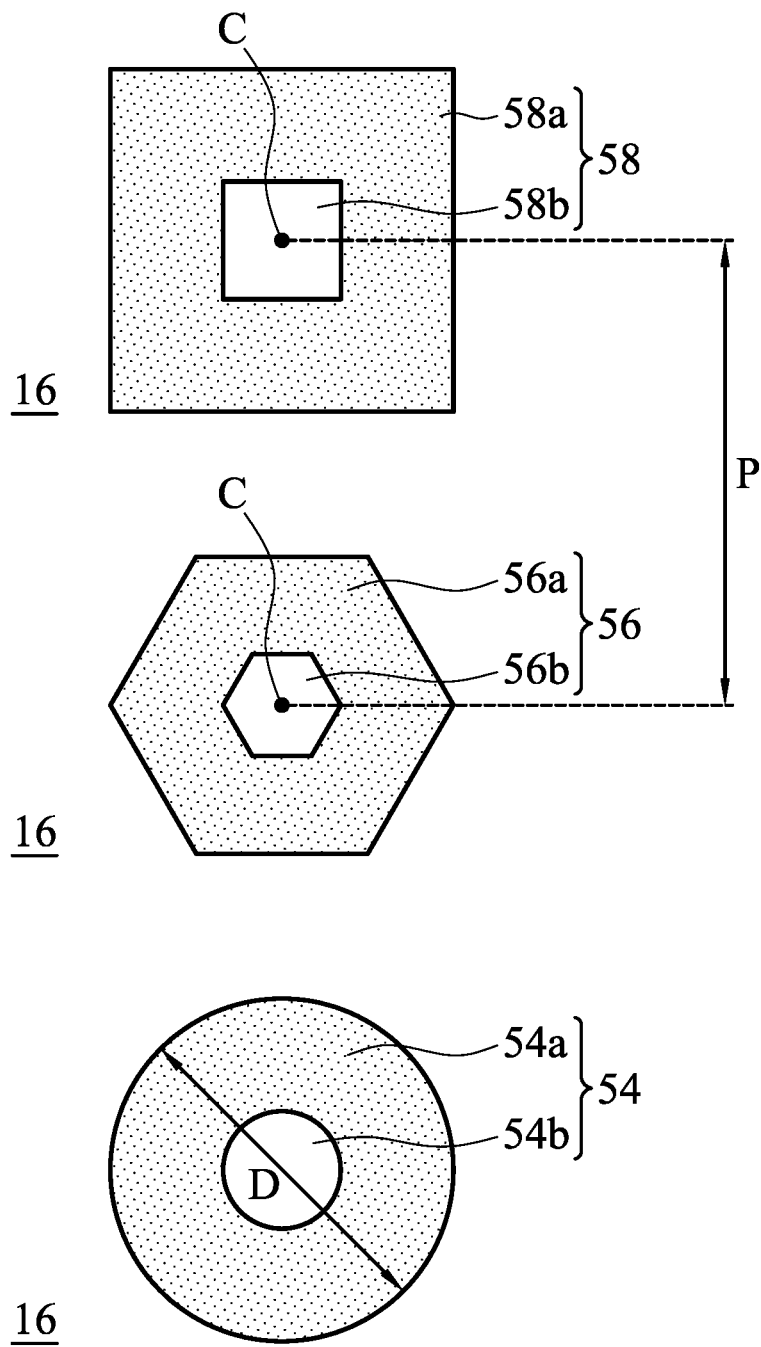
FIG. 6 is a top view of protrusions of an optical structure in accordance with one embodiment of the invention.
Figure 7:
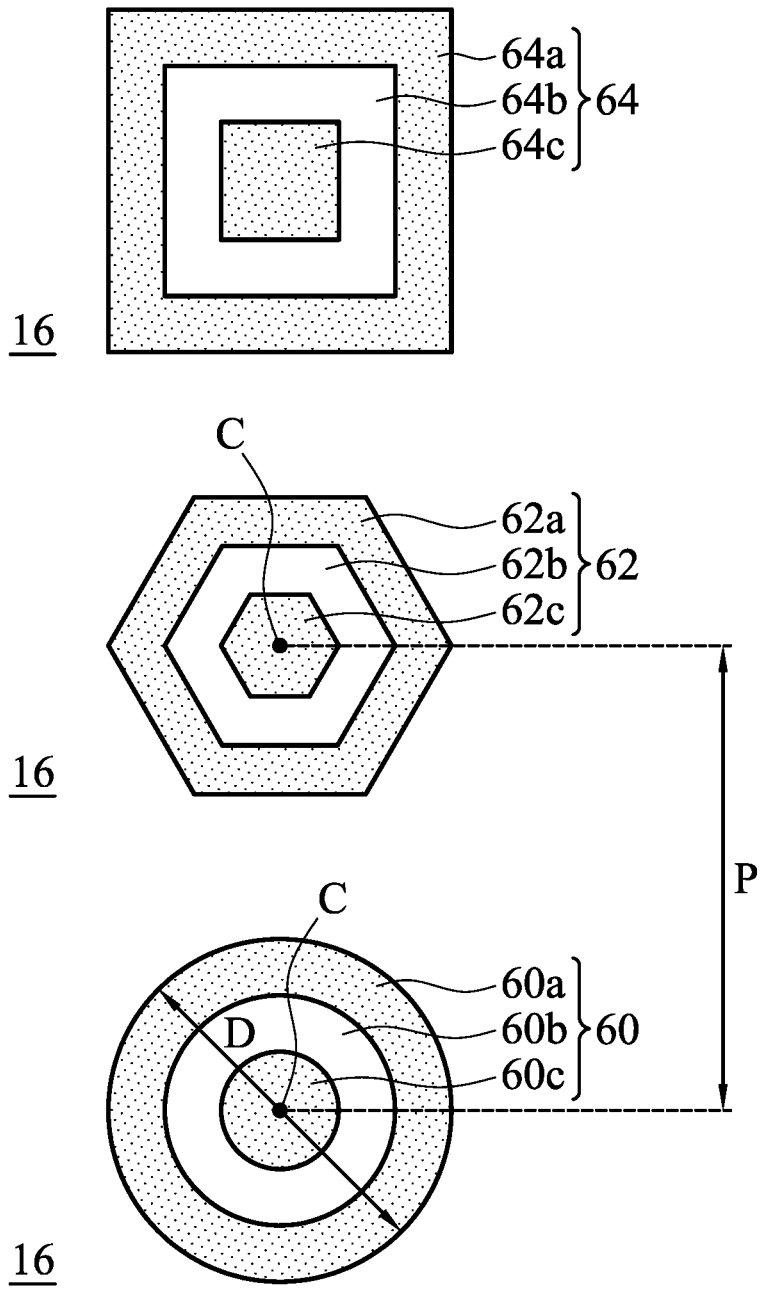
FIG. 7 is a top view of protrusions of an optical structure in accordance with one embodiment of the invention.
Figure 8:
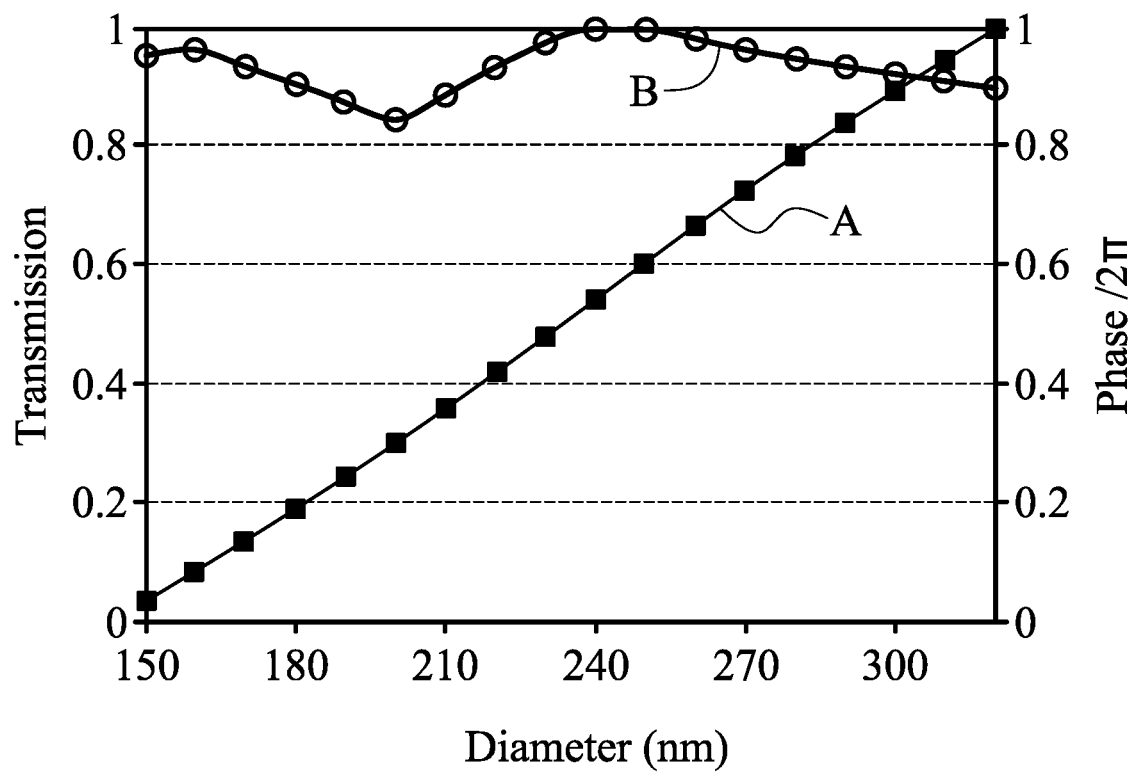
FIG. 8 shows transmission of protrusions and relationship between dimension of protrusions and phase of incident light in accordance with one embodiment of the invention.

Next, the structures, shapes, dimensions and arrangements of the protrusions 16 (i.e. metalenses) are detailed, as shown in FIGS. 5-8. FIGS. 5-7 are top views of the protrusions 16 of the optical structure 10. FIG. 8 shows the transmission of the protrusions 16 and the relationship between the dimensions of the protrusions 16 and the phase of the incident light.

In FIG. 5, the protrusions 16 include solid structures, for example, a solid cylinder 48, a solid hexagonal pillar 50 or a solid square pillar 52. When the protrusions 16 are solid cylinders 48, each of the protrusions 16 has a diameter "D" of about 150 nm to about 300 nm. Specifically, the diameter "D" is a subwavelength dimension. The solid hexagonal pillar 50 and the solid square pillar 52 are also subwavelength dimensions. The "subwavelength dimension" means that the dimension of each of the protrusions 16 is smaller than the wavelength of an applied light source. In addition, each of the protrusions 16 has a center C. There is a pitch "P" between two centers C of adjacent protrusions 16. In some embodiments, the pitch "P" of the protrusions 16 ranges from about 100 nm to about 1,000 nm. In some embodiments, when a light source emits light with a single wavelength of about 850 nm, about 940 nm, about 1350 nm or about 1550 nm, the protrusions 16 with solid structures as shown in FIG. 5 are suitable utilized.

In FIG. 6, the protrusions 16 include hollow structures, for example, a hollow cylinder 54, a hollow hexagonal pillar 56 and a hollow square pillar 58. The hollow cylinder 54 includes a first portion 54a and a space 54b. The space 54b is surrounded by the first portion 54a. The hollow hexagonal pillar 56 includes a first portion 56a and a space 56b. The space 56b is surrounded by the first portion 56a. The hollow square pillar 58 includes a first portion 58a and a space 58b. The space 58b is surrounded by the first portion 58a. When the protrusions 16 are hollow cylinders 54, each of the protrusions 16 has a diameter "D" of about 150 nm to about 300 nm. Specifically, the diameter "D" is a subwavelength dimension. The hollow hexagonal pillar 56 and the hollow square pillar 58 are also subwavelength dimensions. In addition, each of the protrusions 16 has a center C. There is a pitch "P" between two centers C of adjacent protrusions 16. In some embodiments, the pitch "P" of the protrusions 16 ranges from about 100 nm to about 1,000 nm. In some embodiments, when a light source emits light with multiple wavelengths of about 850±5 nm, about 940±5 nm, about 1350±5 nm or about 1550±5 nm, the protrusions 16 with hollow structures as shown in FIG. 6 are suitable utilized.

In FIG. 7, the protrusions 16 include hollow structures, for example, a hollow cylinder 60, a hollow hexagonal pillar 62 and a hollow square pillar 64. The hollow cylinder 60 includes a first portion 60a, a space 60b and a second portion

60c. The second portion 60c is surrounded by the space 60b. The space 60b is surrounded by the first portion 60a. The hollow hexagonal pillar 62 includes a first portion 62a, a space 62b and a second portion 62c. The second portion 62c is surrounded by the space 62b. The space 62b is surrounded by the first portion 62a. The hollow square pillar 64 includes a first portion 64a, a space 64b and a second portion 64c. The second portion 64c is surrounded by the space 64b. The space 64b is surrounded by the first portion 64a. When the protrusions 16 are hollow cylinders 60, each of the protrusions 16 has a diameter "D" of about 150 nm to about 300 nm. Specifically, the diameter "D" is a subwavelength dimension. The hollow hexagonal pillar 62 and the hollow square pillar 64 are also subwavelength dimensions. In addition, each of the protrusions 16 has a center C. There is a pitch "P" between two centers C of adjacent protrusions 16. In some embodiments, the pitch "P" of the protrusions 16 ranges from about 100 nm to about 1,000 nm. In some embodiments, when a light source emits light with multiple wavelengths of about 850±5 nm, about 940±5 nm, about 1350±5 nm or about 1550±5 nm, the protrusions 16 with hollow structures as shown in FIG. 7 are suitable utilized. In practice, light passing through the protrusions 16 may include single wavelength or multiple wavelengths within a certain wavelength range of about 700 to about 3,000, here, solid or hollow protrusions 16 (as shown in FIGS. 5-7) are provided to cope with the above situations, effectively reducing the dispersion (aberration).

The protrusions 16 disclosed by FIGS. 5-7 that are disposed on the bandpass filter 14 include metalenses. In some embodiments, the protrusions 16 may include Fresnel lenses.

Referring to FIG. 8, the optical effect produced by the size distribution of the protrusions 16 is illustrated. The experimental conditions are as follows. The wavelength of the incident light is 940 nm. The protrusions 16 are solid cylinders. The protrusions 16 are disposed on the bandpass filter 14 in an array. The diameter of the protrusions 16 ranges from about 150 nm to about 300 nm. The pitch of the protrusions 16 is 500 nm. As shown in FIG. 8, the size distribution (the diameter of about 150 nm to about 300 nm) of the protrusions 16 controls the phase of the incident light to be between 0 and $2\pi$ ((see curve A), achieving optical maneuverability and controlling wave behavior. In addition, the transmission of the protrusions 16 reaches more than 80%, eliminating the influence of reflection and refraction.

In addition, it is also proved that the protrusions 16 have a focusing function (similar to conventional module lenses), for example, having a focus length of about 1 mm. In accordance with product requirements, various focus lengths are designed.

Figure 9A:
FIGS. 9A-9N are cross-sectional views of a method for fabricating an optical structure in accordance with one embodiment of the invention.
Figure 9B:
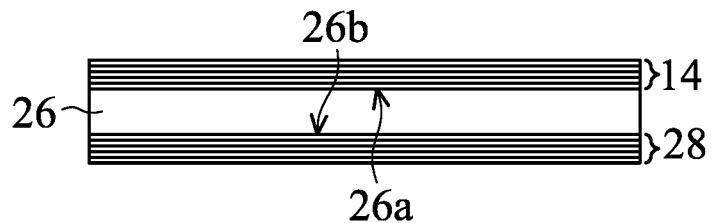
Figure 9C:
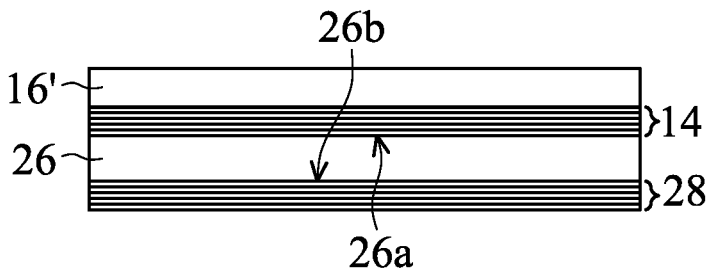
Figure 9D:
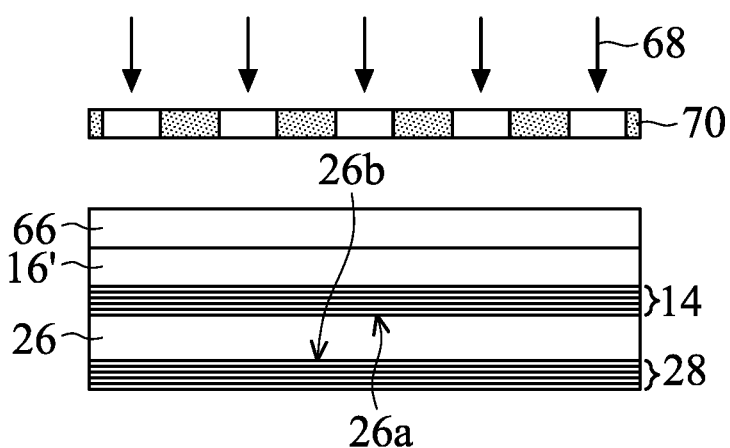
Figure 9E:
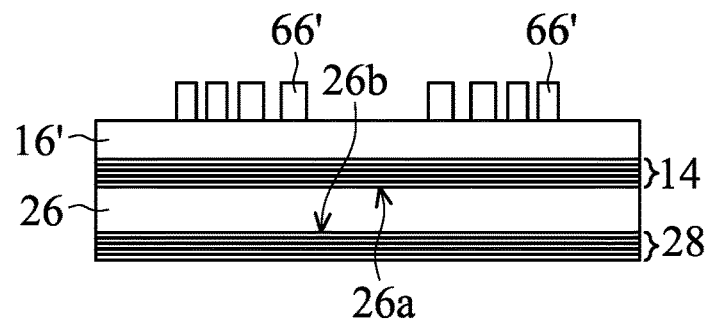
Figure 9F:
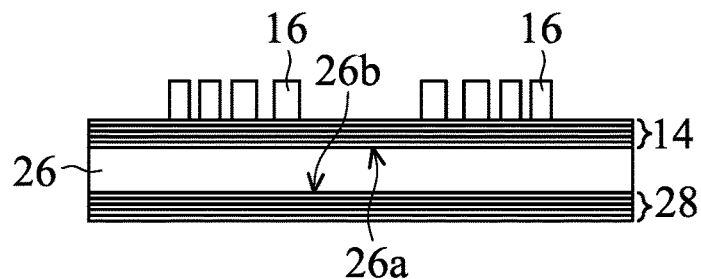
Figure 9G:
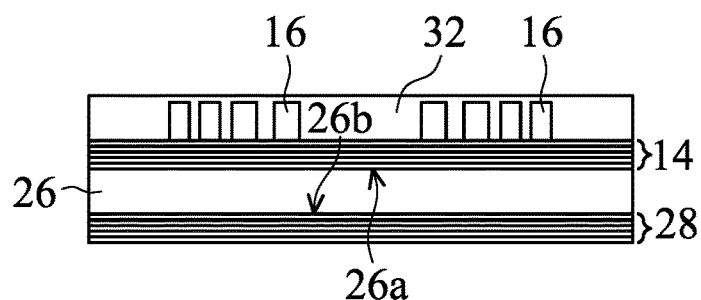
Figure 9H:
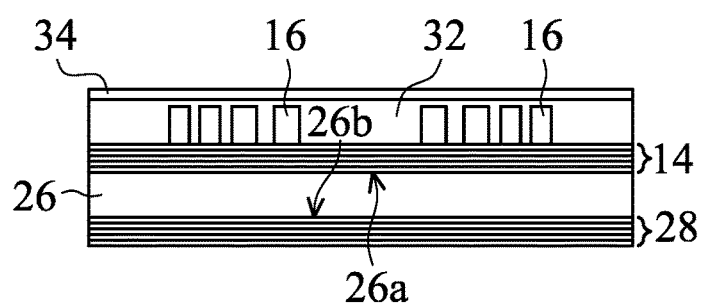
Figure 9I:
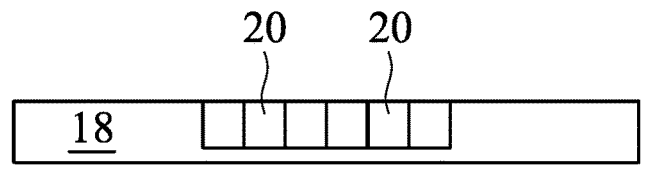
Figure 9J:
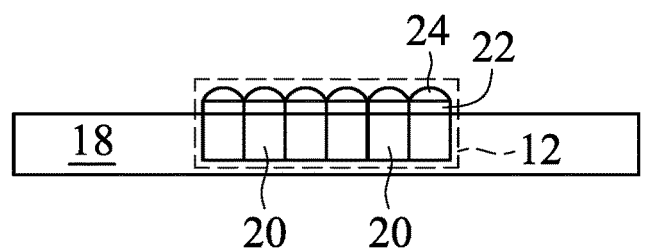
Figure 9K:
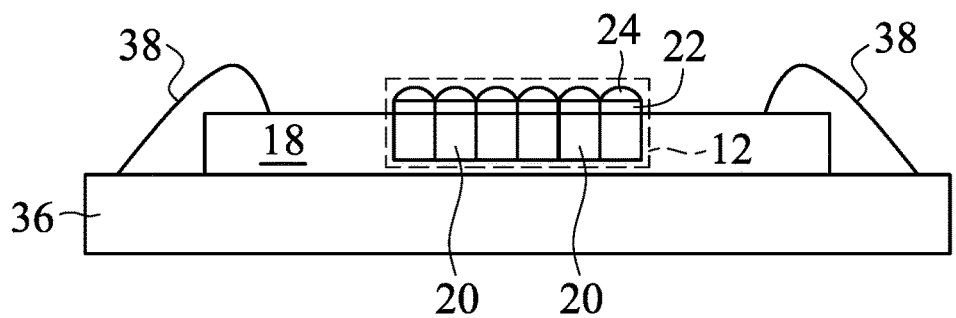
Figure 9L:
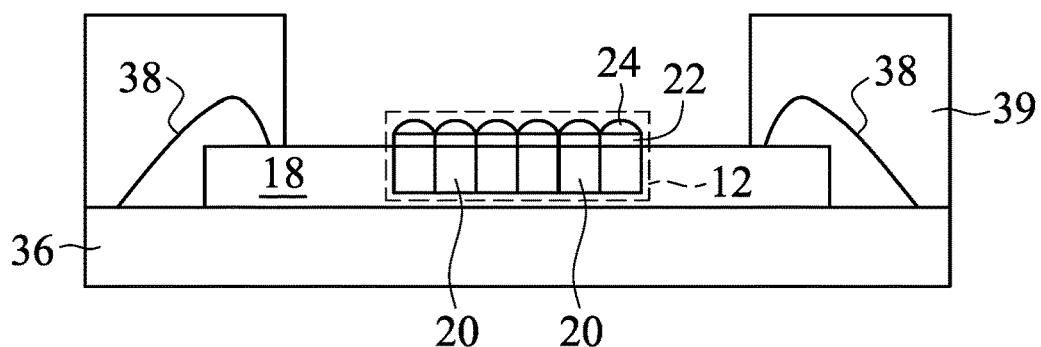
Figure 9M:
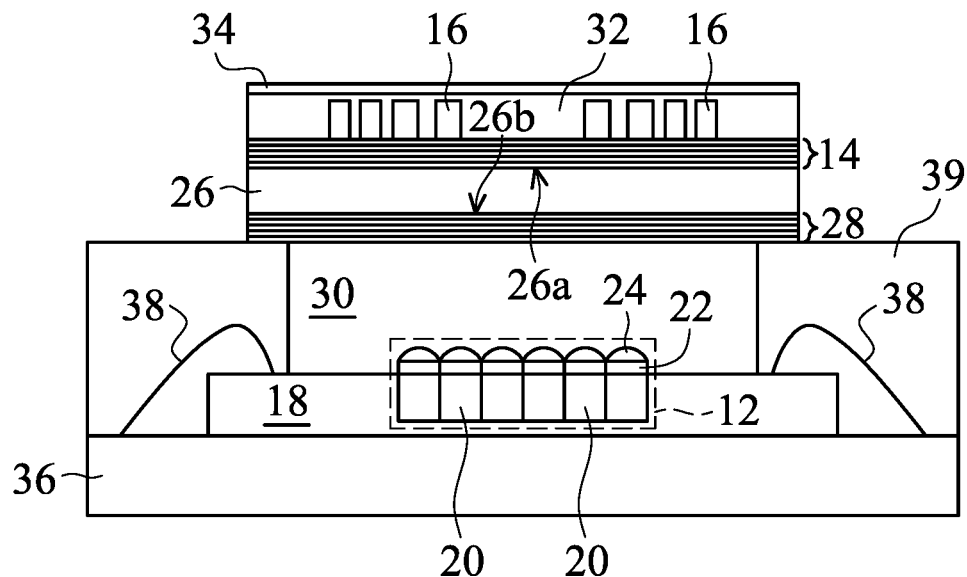
Figure 9N:
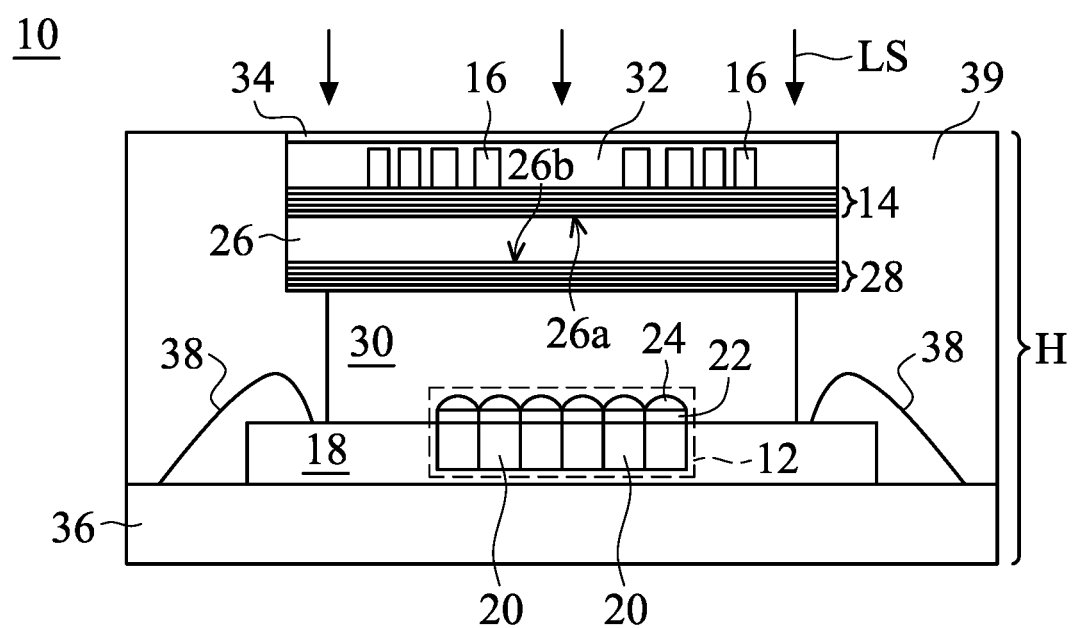

Referring to FIGS. 9A-9N, in accordance with one embodiment of the invention, a method for fabricating an optical structure is provided. FIGS. 9A-9N show cross-sectional views of the method for fabricating an optical structure.

Referring to FIG. 9A, a glass substrate 26 is provided.

Referring to FIG. 9B, a first bandpass filter 14 is formed on the top side 26a of the glass substrate 26, and a second bandpass filter 28 is formed on the bottom side 26b of the glass substrate 26. In some embodiments, the first bandpass filter 14 and the second bandpass filter 28 are respectively formed on the top side 26a and the bottom side 26b of the glass substrate 26 using, for example, sputtering, spin-coating, chemical vapor deposition (CVD), low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), physical vapor deposition process, molecular beam deposition process, any other suitable process or a combination thereof.

Referring to FIG. 9C, a material layer 16' is formed on the first bandpass filter 14. In some embodiments, the material layer 16' is formed on the first bandpass filter 14 using, for example, sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof. In some embodiments, the material of the material layer 16' may include a dielectric material, such as $TiO_2$, SiN, $SiO_2$, SiH or a combination thereof.

Referring to FIGS. 9D to 9F, the material layer 16' is patterned to form a plurality of protrusions 16 by lithography.

Referring to FIG. 9D, a photoresist layer 66 is formed on the material layer 16'. In some embodiments, the photoresist layer 66 is formed on the material layer 16' using, for example, sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof.

In some embodiments, the photoresist layer 66 may include a photoresist material sensitive to a radiation source, for example, a positive-tone resist material or a negative-tone resist material. The photoresist layer 66 may have a multi-layer structure. Furthermore, the photoresist layer 66 may be implemented with a chemical amplification (CA) resist material. The positive-tone chemical amplification (CA) resist material means a polymeric material that becomes soluble in a developer after the polymeric material is exposed to acidic moieties. The negative-tone chemical amplification (CA) resist material means a polymeric material that becomes insoluble in a developer after the polymeric material is exposed to acidic moieties.

The photoresist layer 66 is exposed to a radiation source 68 through a photomask 70 with a pattern. In some embodiments, the radiation source 68 may include UV radiation (i-line), deep ultraviolet (DUV) radiation, and/or extreme ultraviolet (EUV) radiation.

Referring to FIG. 9E, a post-exposure baking and development are performed on the photoresist layer 66 after exposure to form a patterned photoresist layer 66'. The patterned photoresist layer 66' serves as an etching mask for etching.

Referring to FIG. 9F, the material layer 16' is etched using a suitable etchant by, for example, reactive ion etching, neutral beam etching or the like, to form the protrusions 16. The lithography process results a high-resolution patterning and a better process stability.

Alternatively, the material layer 16' is patterned to form a plurality of protrusions 16 by nanoimprint.

For example, a resin layer is formed on the material layer 16'. In some embodiments, the resin layer is formed on the material layer 16' using, for example, sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof.

In some embodiments, the material of the resin layer may include a thermoplastic polymer or a UV curable resin. The thermoplastic polymer may include polyethylene (PE), polypropylene (PP), polystyrene (PS), polymethylmethacrylate (PMMA), polyvinyl chloride (PVC), Nylon, polycarbonate (PC), polyurethane (PU), polytetrafluoroethylene (PTFE, also known as Teflon), polyethylene terephthalate (PET) or a combination thereof. The UV curable resin may include epoxy acrylate, acrylated polyester, acrylated urethane, acrylated silicone or a combination thereof.

Next, a mold with a pattern is applied to the resin layer. Then, the resin layer is cured by heat or UV light depending on the material of the resin layer. After the mold is removed, a patterned resin layer is formed. The patterned resin layer serves as an etching mask for etching.

Next, the material layer 16' is etched using a suitable etchant by, for example, reactive ion etching, neutral beam etching or the like, to form the protrusions 16. The nanoimprint process results a higher process throughput.

Referring to FIG. 9G, a polymer layer 32 is formed on the first bandpass filter 14 and the protrusions 16, and the protrusions 16 are not exposed from the polymer layer 32. In some embodiments, the polymer layer 32 is formed on the first bandpass filter 14 and the protrusions 16 using, for example, sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof. In some embodiments, the polymer layer 32 may include high-transmittance polymer material with a refractive index of about 1.2 to about 2.0.

Referring to FIG. 9H, an anti-reflective layer 34 is formed on the polymer layer 32. In some embodiments, the anti-reflective layer 34 is formed on the polymer layer 32 using, for example, sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof.

Referring to FIG. 9I, a substrate 18 including a plurality of photoelectric conversion units 20 is provided.

Referring to FIG. 9J, a plurality of color filters 22 are formed on the substrate 18 and respectively correspond to the photoelectric conversion units 20. A plurality of microlenses 24 are formed on the color filters 22 and respectively correspond to the photoelectric conversion units 20.

Referring to FIG. 9K, the substrate 18 is connected to a printed circuit board (PCB) 36 by wire bonding 38.

Referring to FIG. 9L, an encapsulation material 39 covers a part of the substrate 18 and the printed circuit board (PCB) 36.

Referring to FIG. 9M, the structure of FIG. 9H is bonded on the structure of FIG. 9L, leaving a space 30.

Referring to FIG. 9N, the encapsulation material 39 surrounds the structure of FIG. 9H. Therefore, the optical structure 10 of FIG. 1 is fabricated.

Referring to FIGS. 10A-10D, in accordance with one embodiment of the invention, a method for fabricating an optical structure is provided. FIGS. 10A-10D show cross-sectional views of the method for fabricating an optical structure.

Figure 10A:
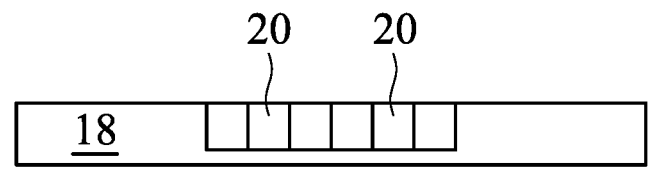
FIGS. 10A-10D are cross-sectional views of a method for fabricating an optical structure in accordance with one embodiment of the invention.

Referring to FIG. 10A, a substrate 18 including a plurality of photoelectric conversion units 20 is provided.

Figure 10B:
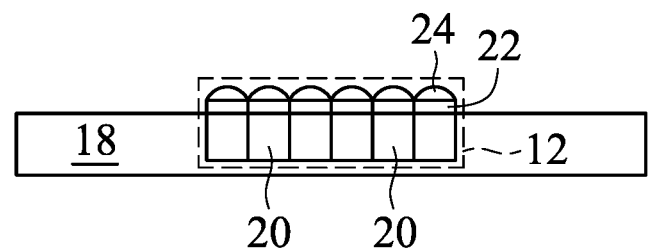

Referring to FIG. 10B, a plurality of color filters 22 are formed on the substrate 18 and respectively correspond to the photoelectric conversion units 20. A plurality of microlenses 24 are formed on the color filters 22 and respectively correspond to the photoelectric conversion units 20.

Figure 10C:
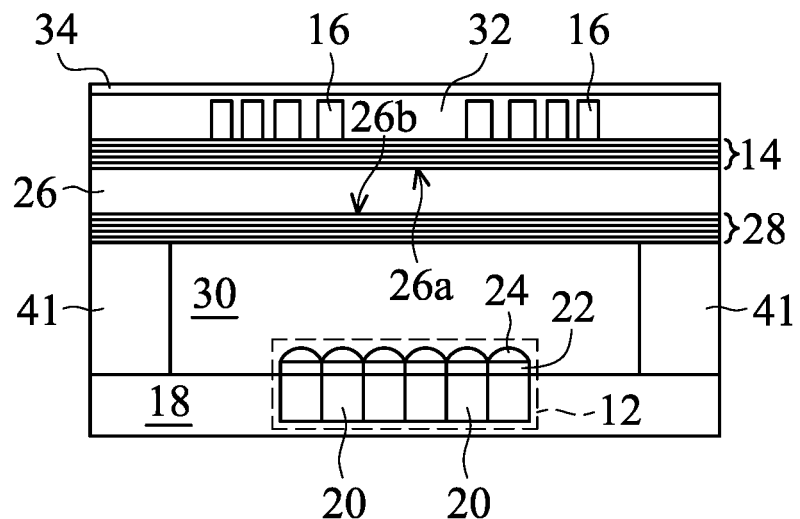

Referring to FIG. 10C, an encapsulation material 41 covers a part of the substrate 18. The structure of FIG. 9H is bonded on the encapsulation material 41, leaving a space 30.

Figure 10D:
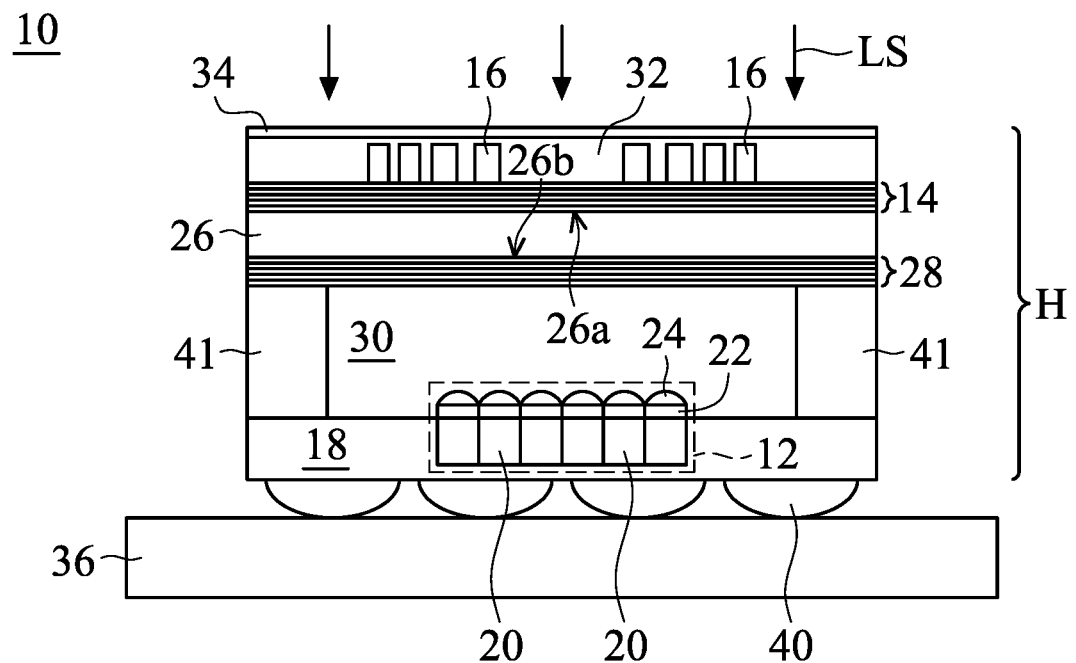

Referring to FIG. 10D, the substrate 18 is connected to a printed circuit board (PCB) 36 by solder balls 40. Therefore, the optical structure 10 of FIG. 2 is fabricated.

Referring to FIGS. 11A-11L, in accordance with one embodiment of the invention, a method for fabricating an optical structure is provided. FIGS. 11A-11L show cross-sectional views of the method for fabricating an optical structure.

Figure 11A:
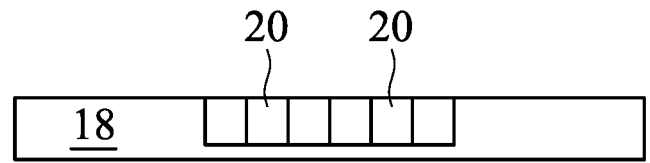
FIGS. 11A-11L are cross-sectional views of a method for fabricating an optical structure in accordance with one embodiment of the invention.

Referring to FIG. 11A, a substrate 18 including a plurality of photoelectric conversion units 20 is provided.

Figure 11B:
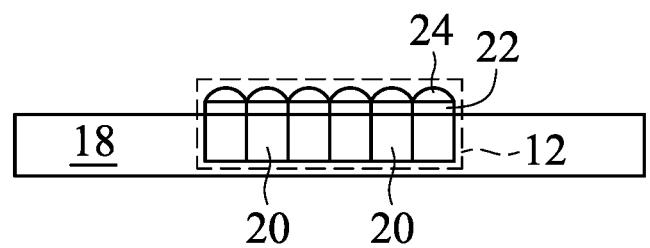

Referring to FIG. 11B, a plurality of color filters 22 are formed on the substrate 18 and respectively correspond to the photoelectric conversion units 20. A plurality of microlenses 24 are formed on the color filters 22 and respectively correspond to the photoelectric conversion units 20.

Figure 11C:
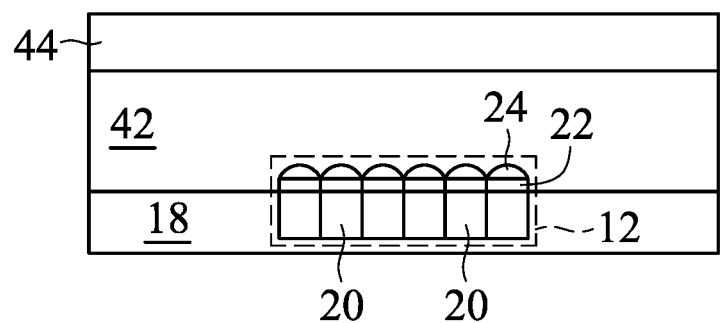

Referring to FIG. 11C, a low-refractive-index material layer 42 is formed on the substrate 18 and covers the color filters 22 and the microlenses 24. A polymer layer 44 is then formed on the low-refractive-index material layer 42. In some embodiments, the low-refractive-index material layer 42 and the polymer layer 44 are formed by, for example, sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof.

Figure 11D:
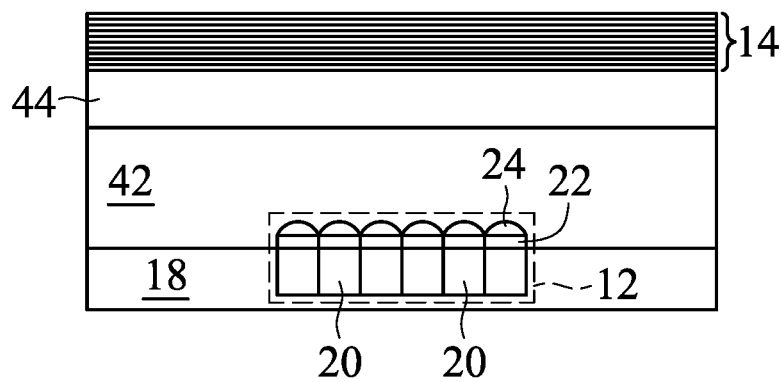

Referring to FIG. 11D, a bandpass filter 14 is formed on the polymer layer 44. In some embodiments, the bandpass filter 14 is formed on the polymer layer 44 using, for example, sputtering, spin-coating, chemical vapor deposition, low-pressure chemical vapor deposition, low-temperature chemical vapor deposition, rapid thermal chemical vapor deposition, plasma enhanced chemical vapor deposition, atomic layer deposition, physical vapor deposition process, molecular beam deposition process, any other suitable process or a combination thereof.

Figure 11E:
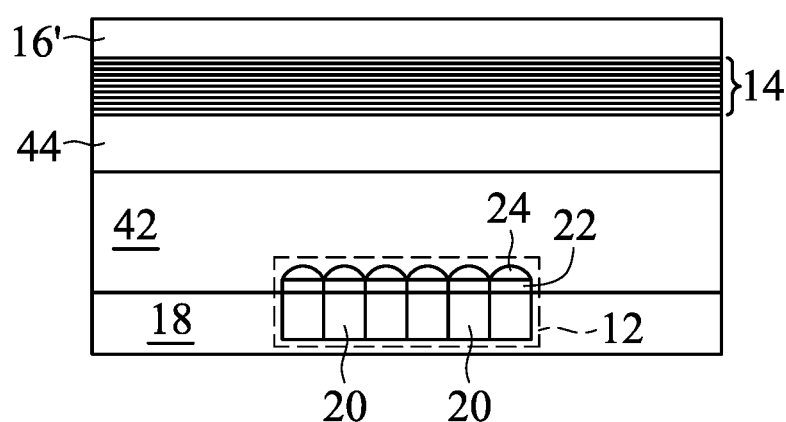

Referring to FIG. 11E, a material layer 16' is formed on the bandpass filter 14, which is similar to FIG. 9C.

Figure 11F:
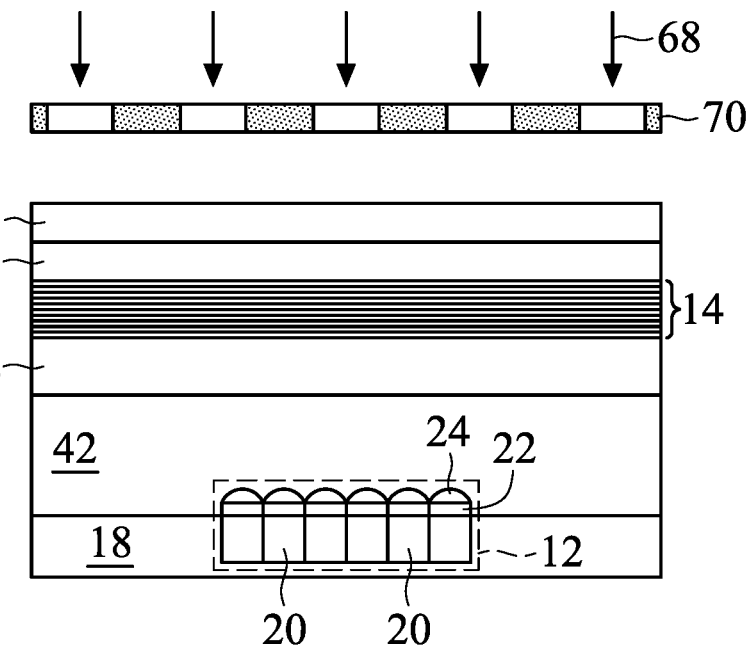
Figure 11G:
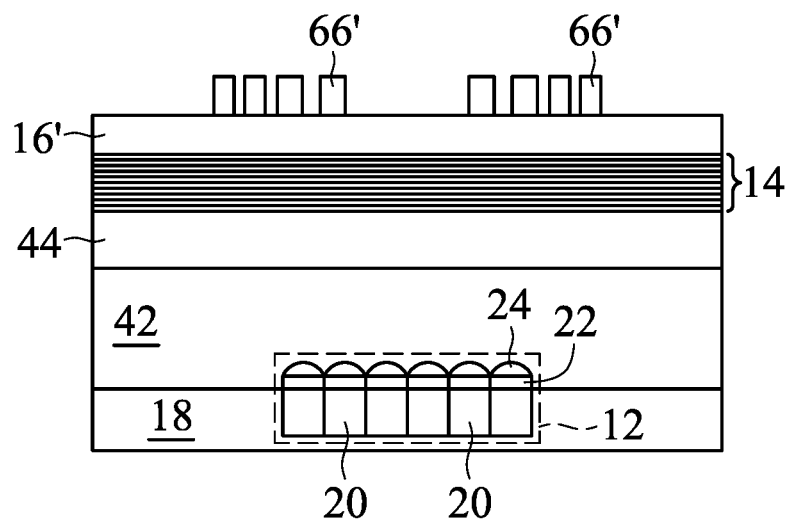
Figure 11H:
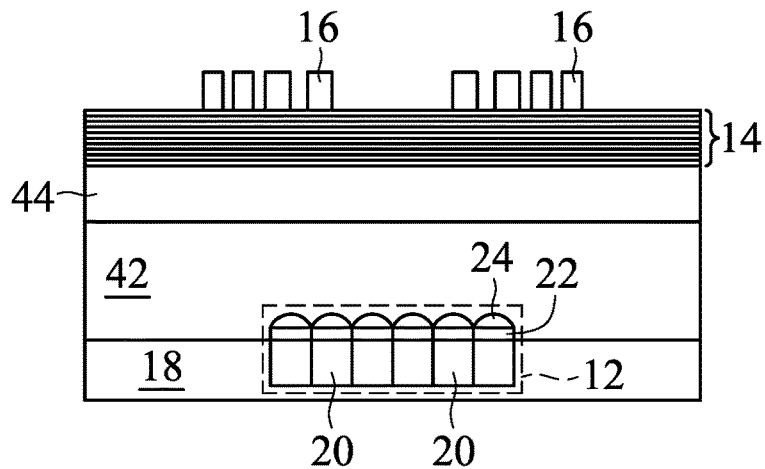

Referring to FIGS. 11F to 11H, the material layer 16' is patterned to form a plurality of protrusions 16 by lithography processes which are similar to FIGS. 9D to 9F. Also, the material layer 16' is patterned to form a plurality of protrusions 16 by nanoimprint processes which are similar to the aforementioned related processes.

Figure 11I:
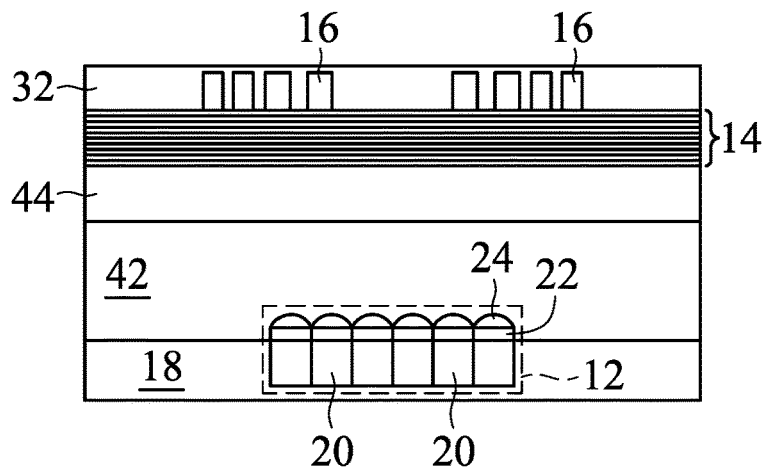

Referring to FIG. 11I, a polymer layer 32 is formed on the bandpass filter 14 and the protrusions 16, and the protrusions 16 are not exposed from the polymer layer 32, which is similar to FIG. 9G.

Figure 11J:
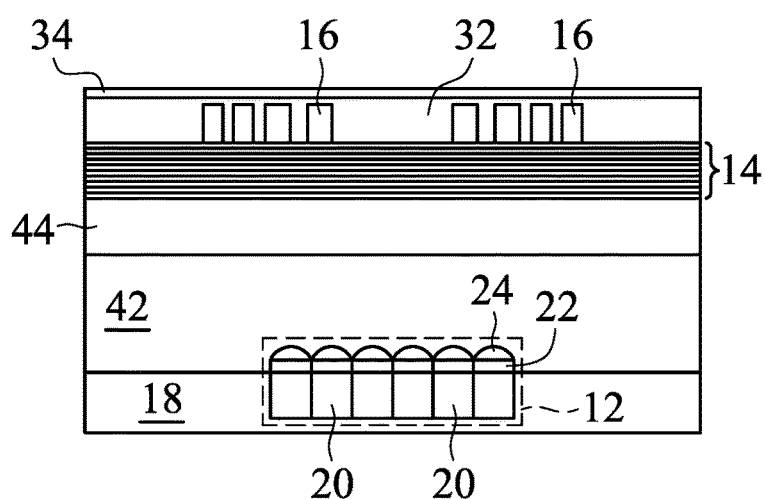

Referring to FIG. 11J, an anti-reflective layer 34 is formed on the polymer layer 32, which is similar to FIG. 9H.

Figure 11K:
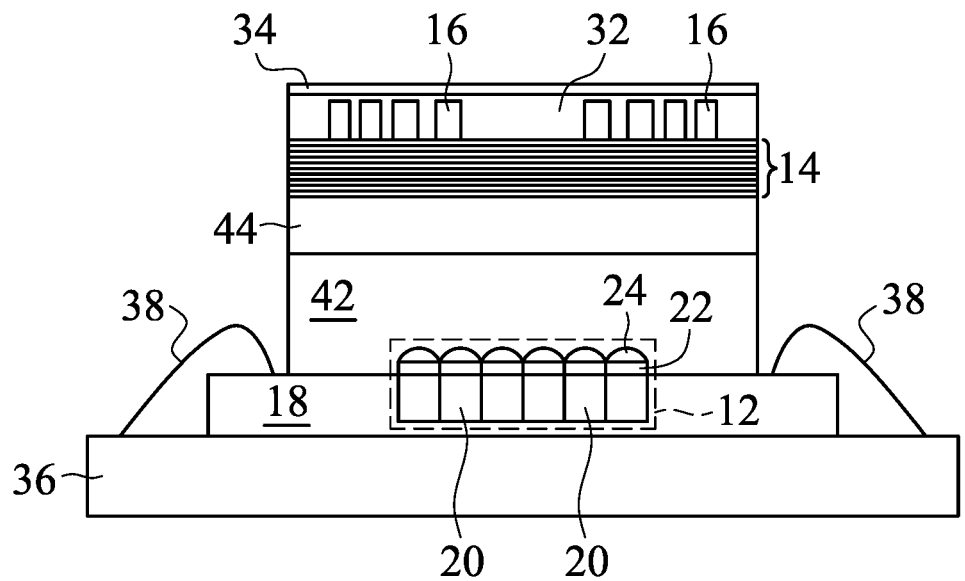

Referring to FIG. 11K, the substrate 18 is connected to a printed circuit board (PCB) 36 by wire bonding 38.

Figure 11L:
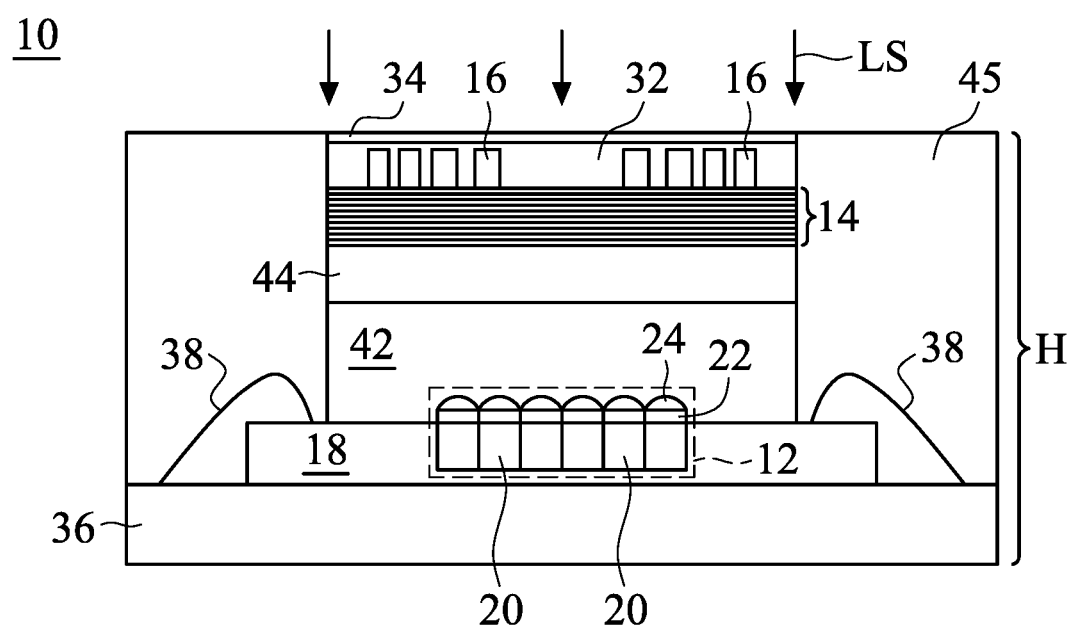

Referring to FIG. 11L, an encapsulation material 45 covers and surrounds a part of the substrate 18 and the components formed thereon and the printed circuit board (PCB) 36. Therefore, the optical structure 10 of FIG. 3 is fabricated.

The present invention replaces conventional vertically-stacked module lens by planar lens (for instance, metalens or Fresnel lens). When the planar lens and a bandpass filter are combined on a glass substrate with an appropriate thickness and packaged in a COB (Chip On Board) manner, the height of the overall package is reduced to less than about 2 mm. When the planar lens and a bandpass filter are combined on a glass substrate with an appropriate thickness and packaged in a CSP (Chip Scale Package) manner, the height of the overall package is reduced to less than about 1.2 mm, and the package dimension in X-Y direction is also reduced. When the planar lens and a bandpass filter are stacked on a chip by a wafer process and packaged in a COB (Chip On Board) manner, the height of the overall package is reduced to less than about 1.0 mm. The optimal size distribution of the planar lens controls the phase of the incident light to be between 0 and 2 $\pi$, achieving optical maneuverability and controlling wave behavior. In addition, the transmission of the planar lens reaches more than about 80%, eliminating the influence of reflection and refraction. The planar lens has a focusing function, which is also enough to show that it can replace conventional vertically-stacked module lenses. Furthermore, the solid or hollow planar lens copes with the situation that light passing through the planar lens may include single wavelength or multiple wavelengths, effectively reducing the dispersion (aberration).

Although some embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. An optical structure, comprising:
   a sensor, comprising a semiconductor substrate and a plurality of photoelectric conversion units disposed in the semiconductor substrate;
   a first bandpass filter disposed above the plurality of photoelectric conversion units of the sensor, wherein first bandpass filter comprises SiH, SiGe, GeH or a combination thereof;
   a plurality of first protrusions disposed on and directly contacted with the first bandpass filter;
   a first polymer layer covering the first bandpass filter and the plurality of first protrusions; and
   an encapsulation material bonded on the semiconductor substrate of the sensor and disposed between the semiconductor substrate of the sensor and the first bandpass filter;
   wherein each of the plurality of first protrusions includes a first end surface directly contacted with the first bandpass filter and a second end surface directly contacted with and not exposed from the polymer layer;
   wherein a refractive index of the plurality of first protrusions is higher than a refractive index of the first polymer layer.

2. The optical structure as claimed in claim 1, wherein the sensor comprises a CMOS image sensor or a fingerprint sensor.

3. The optical structure as claimed in claim 1, wherein the first bandpass filter allows light with a wavelength of 700 nm to 3,000 nm to pass through.

4. The optical structure as claimed in claim 1, wherein the plurality of first protrusions comprise cylinders, hexagonal pillars or square pillars, at least one of the plurality of first protrusions comprises a first portion and a space surrounded by the first portion, and the at least one of the plurality of first protrusions further comprises a second portion surrounded by the space.

5. The optical structure as claimed in claim 1, wherein the plurality of first protrusions are cylinders, and each of the protrusions has a diameter of 150 nm to 300 nm.

6. The optical structure as claimed in claim 1, wherein the plurality of first protrusions have a pitch of 100 nm to 1,000 nm.

7. The optical structure as claimed in claim 1, wherein the plurality of first protrusions have a size distribution that controls a phase of an incident light to be between 0 and $2\pi$.

8. The optical structure as claimed in claim 1, further comprising an anti-reflective layer disposed on the first polymer layer.

9. The optical structure as claimed in claim 1, wherein the semiconductor substrate of the sensor is connected to a printed circuit board by wire bonding.

10. The optical structure as claimed in claim 1, wherein the semiconductor substrate of the sensor is connected to a printed circuit board by solder balls.

11. The optical structure as claimed in claim 1, wherein the plurality of first protrusions comprise a high-refractive-index material with a refractive index of 3.0 to 5.0.

12. The optical structure as claimed in claim 11, wherein the plurality of first protrusions comprise $TiO_2$, SiN, $SiO_2$, SiH or a combination thereof.

13. The optical structure as claimed in claim 1, further comprising a low-refractive-index material layer disposed between the semiconductor substrate of the sensor and the first bandpass filter.

14. The optical structure as claimed in claim 13, further comprising a second polymer layer disposed between the low-refractive-index material layer and the first bandpass filter.

15. The optical structure as claimed in claim 14, further comprising a plurality of second protrusions disposed in the second polymer layer.

16. The optical structure as claimed in claim 1, further comprising a glass substrate having a thickness of 50 μm to 500 μm disposed between the semiconductor substrate of the sensor and the first bandpass filter, wherein the first bandpass filter is disposed on a top side of the glass substrate.

17. The optical structure as claimed in claim 16, further comprising a second bandpass filter disposed on a bottom side of the glass substrate.

18. The optical structure as claimed in claim 16, wherein there is a space between the semiconductor substrate of the sensor and the glass substrate.

19. The optical structure as claimed in claim 18, further comprising a low-refractive-index material, a normal-refractive-index material or a combination thereof filled in the space.

* * * * *